US009935580B2

(12) United States Patent
Beebe et al.

(10) Patent No.: US 9,935,580 B2
(45) Date of Patent: *Apr. 3, 2018

(54) WIEN BRIDGE OSCILLATOR

(71) Applicant: Jabil Circuit, Inc., St. Petersburg, FL (US)

(72) Inventors: Ronald Beebe, St. Petersburg, FL (US); Christopher D. Compton, St. Petersburg, FL (US); David Eckerson, St. Petersburg, FL (US); Yizhe Liu, St. Petersburg, FL (US); Salman Talebi, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/251,487

(22) Filed: Aug. 30, 2016

(65) Prior Publication Data

US 2016/0373059 A1    Dec. 22, 2016

Related U.S. Application Data

(63) Continuation of application No. 14/675,073, filed on Mar. 31, 2015.

(60) Provisional application No. 62/047,443, filed on Sep. 8, 2014.

(51) Int. Cl.
| | |
|---|---|
| *H03B 5/26* | (2006.01) |
| *H03B 5/10* | (2006.01) |
| *H03B 5/22* | (2006.01) |
| *H02M 3/158* | (2006.01) |
| *H02M 7/48* | (2007.01) |
| *H02M 7/219* | (2006.01) |

(52) U.S. Cl.
CPC .............. *H03B 5/26* (2013.01); *H02M 3/158* (2013.01); *H02M 7/219* (2013.01); *H02M 7/48* (2013.01); *H03B 5/10* (2013.01); *H03B 5/22* (2013.01); *H02M 2007/2195* (2013.01); *Y02B 70/1408* (2013.01)

(58) Field of Classification Search
CPC .. H03B 5/00; H03B 5/26; H02M 7/48; H02M 7/219; H02M 3/158
USPC ........ 331/138, 141, 108 D, 140, 135, 108 B, 331/108 R, 107 R, 143
See application file for complete search history.

(56) References Cited

U.S. PATENT DOCUMENTS 3,835,418 A * 9/1974 Gilbert ...................... H03L 5/00
331/110

\* cited by examiner

*Primary Examiner* — Arnold Kinkead
(74) *Attorney, Agent, or Firm* — Thomas J. McWilliams; Barnes & Thornburg LLP (57) ABSTRACT

An oscillator circuit that includes a Wien bridge oscillator circuit, a full-wave rectifier circuit, coupled to an output of the Wien bridge oscillator circuit, an integrator circuit, coupled to an output of the full-wave rectifier circuit, and a multiplier circuit. The multiplier circuit may include a first input coupled to the output of the Wien bridge oscillator circuit, and a second input, coupled to an output of the integrator, wherein the multiple signals are configured to provide dynamic gain control to the Wien bridge oscillator circuit.

4 Claims, 13 Drawing Sheets

WIEN BRIDGE OSCILLATOR

RELATED APPLICATIONS

This is a Continuation Application of application Ser. No. 14/675,073, filed Mar. 31, 2015, which claims priority to U.S. Provisional Patent Application No. 62/047443, titled "Synchronous Buck Inverter," filed Sep. 8, 2014, the contents of which is incorporated by reference in its entirety herein.

FIELD OF THE DISCLOSURE

The present disclosure is directed to oscillators. More specifically, the present disclosure relates to Wien bridge oscillators, such as for providing or simulating a pure sine wave for use in electrical applications, such as power applications.

BACKGROUND

Conventional oscillator circuits are designed so that they will start oscillating ("start up") and that their respective amplitude will be controlled. For a linear circuit to oscillate, it must meet the "Barkhausen conditions," that is, the loop gain must be one and the phase around the loop must be an integer multiple of 360 degrees. In practice, the loop gain is initially larger than unity. Random noise is present in all circuits, and some of that noise will be near the desired frequency. A loop gain greater than one allows the amplitude of frequency to increase exponentially each time around the loop. With a loop gain greater than one, the oscillator will start. However, with a loop gain of greater than one, significant harmonic distortion is introduced, and the frequency stability of the oscillator may be affected.

A Wien bridge oscillator is a type of electronic oscillator that generates sine waves under a large range of frequencies. The Wien bridge oscillator is typically based on a bridge circuit comprising comprises four resistors and two capacitors (see FIG. 1). In use, the oscillator can operate as a positive gain amplifier combined with a band pass filter that provides positive feedback. In certain applications, such as power applications, Wien bridge oscillators may be used as inputs for circuit control and/or voltage reference (e.g., for power inverters). However, the quality of the sine wave produced by conventional Wien bridge oscillators is often subject to noise and distortion, and is not able to effectively simulate or approximate a true (or "pure") sine wave.

SUMMARY

Accordingly, in some illustrative embodiments, an oscillator circuit is disclosed, comprising a Wien bridge oscillator circuit, a full-wave rectifier circuit, coupled to an output of the Wien bridge oscillator circuit, an integrator circuit, coupled to an output of the full-wave rectifier circuit, and a multiplier circuit, comprising a first input coupled to the output of the Wien bridge oscillator circuit, and a second input, coupled to an output of the integrator, the multiple signal configured to provide a signal to an input of the Wien bridge oscillator circuit.

In some illustrative embodiments, the oscillator circuit may further comprise a RC circuit, coupled between the output of the full-wave rectifier circuit and the integrator circuit. In some illustrative embodiments, the multiplier circuit comprises an XY multiplier, and the XY multiplier is coupled to an inverting amplifier input of the Wien bridge oscillator circuit. Additionally, in some illustrative embodiments, the multiplier circuit is configured to execute a transfer function on voltage received at the first input and the second input, while the full wave rectifier is configured to execute a different transfer function on the voltage received at an input.

In some illustrative embodiments, the multiplier circuit may be configured to dynamically control gain in the Wien bridge oscillator circuit. An output of the integrator circuit is coupled to a synchronous buck circuit. The integrator circuit may be configured to provide a sinusoidal reference signal to the synchronous buck circuit.

BRIEF DESCRIPTION OF THE FIGURES

The present disclosure will become more fully understood from the detailed description given herein below and the accompanying drawings which are given by way of illustration only, and which thus do not limit the present disclosure, and wherein.

DETAILED DESCRIPTION

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Figure 1:
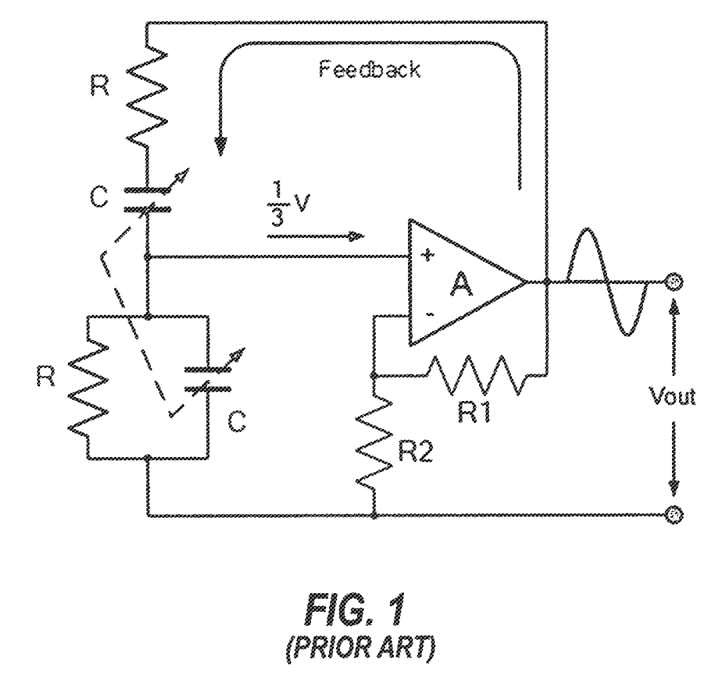
FIG. 1 illustrates a conventional Wien bridge oscillator configured to provide a sine wave output.

Turning now to FIG. 1, a conventional Wien bridge oscillator for forming sine waves over a various range of frequencies. The bridge comprises four resistors and two capacitors. The oscillator can also be viewed as a positive gain amplifier combined with a band pass filter that provides positive feedback. In use, the output of the operational amplifier (A) is fed back to both the inputs (− and +, or inverting and non-inverting) of the amplifier. One portion of the feedback signal in FIG. 1 is connected to the inverting input terminal (negative feedback) via the resistor divider network of R1 and R2 which allows the amplifiers voltage gain to be adjusted within narrow limits. The other part is fed back to the non-inverting input terminal (positive feedback) via the RC Wien Bridge network.

The RC network is connected in the positive feedback path of the amplifier and has zero phase shift at just one frequency. Then at the selected resonant frequency (fr), the non-inverting input may be slightly larger than the inverting input, allowing the circuit to oscillate.

In the oscillator of FIG. 1, the voltage gain of the amplifier circuit must be equal to or greater than three "Gain=3" for oscillations to start because as will be explained below, the non-inverting input is ⅓ of the output voltage (⅓ V). This value, (Av≥3), is set by the feedback resistor network, R1 and R2 and for a non-inverting amplifier this is given as the ratio 1+(R1/R2). Also, due to the open-loop gain limitations of operational amplifiers, frequencies above 1 MHz are unachievable without the use of special high frequency op-amps.

The Wien bridge oscillator if FIG. 1 is based on a frequency-selective form of a Wheatstone bridge circuit. The Wien bridge oscillator is a two-stage RC coupled amplifier circuit that uses a feedback circuit consisting of a series RC circuit connected with a parallel RC of the same component values producing a phase delay or phase advance circuit depending upon the frequency. At the resonant frequency fr the phase shift is 0°.

Figure 2:
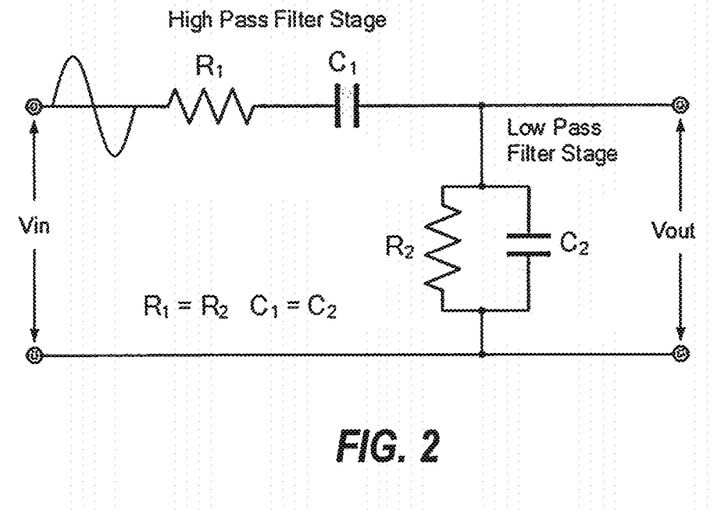
FIG. 2 illustrates a RC phase shift network model of the Wien bridge oscillator of FIG. 1.

Turning now to FIG. 2, the conventional RC network may be modeled as a series RC circuit connected to a parallel RC forming basically a High Pass Filter connected to a Low Pass Filter producing a very selective second-order frequency dependant band pass filter at the selected frequency (Fr). At low frequencies, the reactance of the series capacitor (C1) is very high so it acts like an open circuit and blocks any input signal at $V_{in}$. Therefore there is no output signal, $V_{OUT}$. At high frequencies, the reactance of the parallel capacitor, (C2) is very low so this parallel connected capacitor acts like a short circuit on the output so again there is no output signal.

Figure 3A:
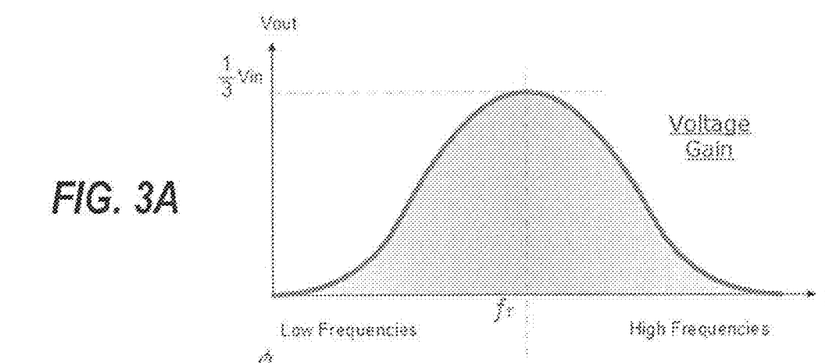
FIG. 3A illustrates a simulated waveform for a oscillator voltage gain for the Wien bridge oscillator of FIG. 1.
Figure 3B:
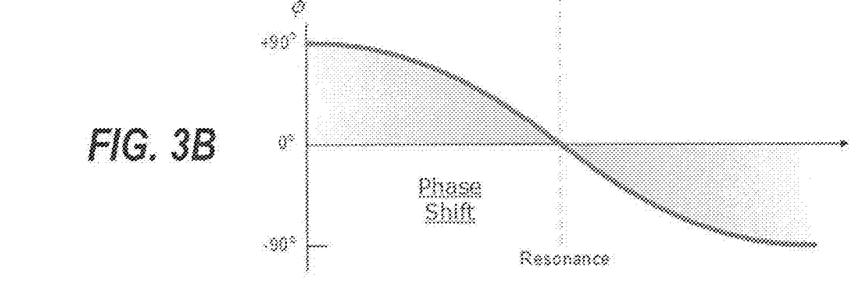
FIG. 3B illustrates a simulated waveform for a oscillator phase shift for the Wien bridge oscillator of FIG. 1.

However, between these two extremes the output voltage reaches a maximum value with the frequency at which this happens being called the resonant frequency, (Fr). At this resonant frequency, the circuit reactance equals its resistance as $X_c=R$ so the phase shift between the input and output equals zero degrees. The magnitude of the output voltage is therefore at its maximum and is equal to one third (⅓) of the input voltage as shown in FIGS. 3A and 3B. It can be seen that at very low frequencies the phase angle between the input and output signals is "positive" (phase advanced), while at very high frequencies the phase angle becomes "negative" (phase delay). In the middle of these two points the circuit is at its resonant frequency, (fr) with the two signals being "in-phase" or 0°. This resonant frequency point may be defined as $$fr = \frac{1}{2\pi RC}$$

where $f_r$ is the resonant frequency in hertz, R is the resistance in ohms, and C is the capacitance in farads. The frequency selective RC network forms the basis of the Wien bridge oscillator circuit, where the RC network configured across a non-inverting amplifier as shown in FIG. 1 has a gain of 1+R1/R2.

Figure 4:
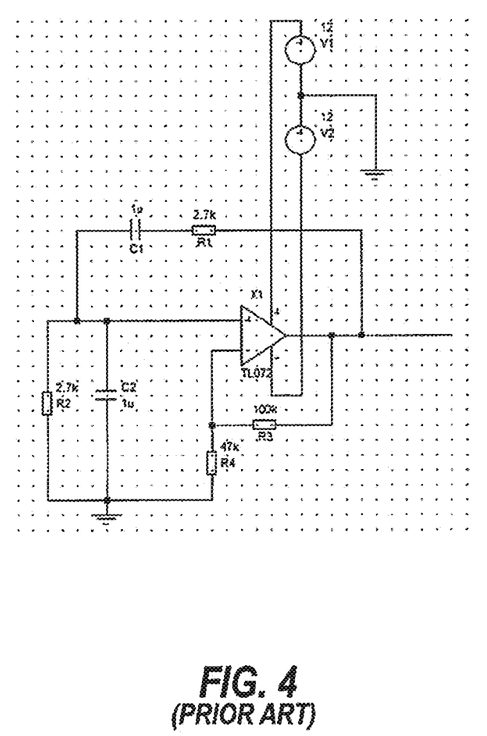
FIG. 4 illustrates a detailed configuration for a conventional Wien bridge oscillator for providing a sine wave output.
Figure 5:
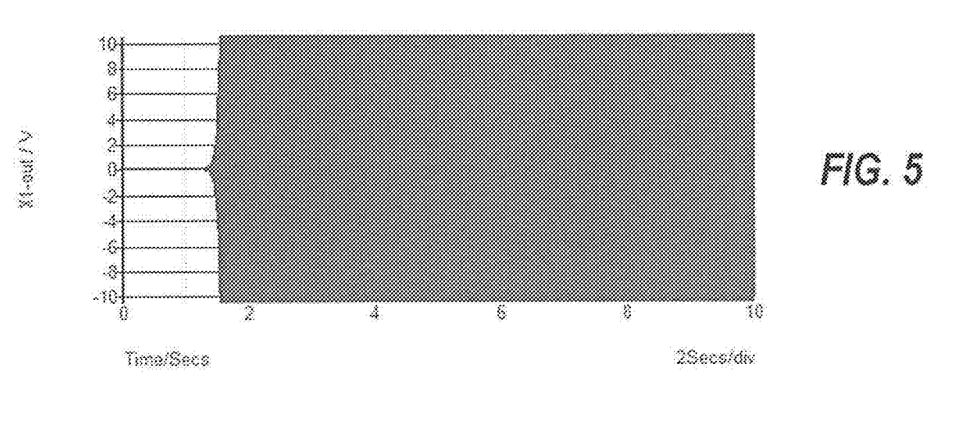
FIG. 5 shows a simulated output waveform for the Wien bridge circuit of FIGS. 4 or FIG. 1, illustrating an at least partially saturated state.
Figure 6:
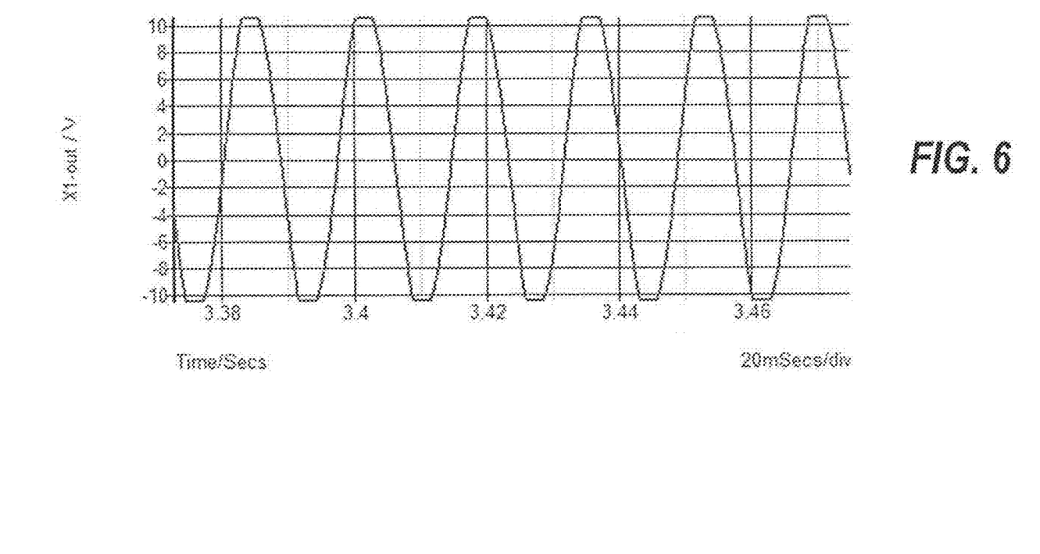
FIG. 6 shows a magnification of the simulated output waveform of FIG. 5 for the Wien bridge circuit of FIGS. 4 or FIG. 1, illustrating an at least partially saturated state.

Turning now to FIG. 4, a conventional Wien bridge oscillator, similar to that disclosed in FIG. 1 is disclosed, where illustrative resistive and capacitive values are shown. Here, it can be seen that the gain of Wien bridge oscillator is 1+R1/R2, or 1+100 kΩ/47 kΩ=3.13. The resonant frequency of the Wien bridge oscillator is fr=1/2πRC, or 1/(6.28×2.7 kΩ×1 uF)=58.97 Hz. As can be seen from the simulated output waveform of FIG. 5, the Wien bridge oscillator starts oscillation at a gain of 3.13, which in turn saturates at peak voltages. This saturation may be seen in the magnified simulated waveform of FIG. 6, where it can be seen in greater detail how the op-amp saturates at the peak voltages because the gain is greater than 3.

Figure 7:
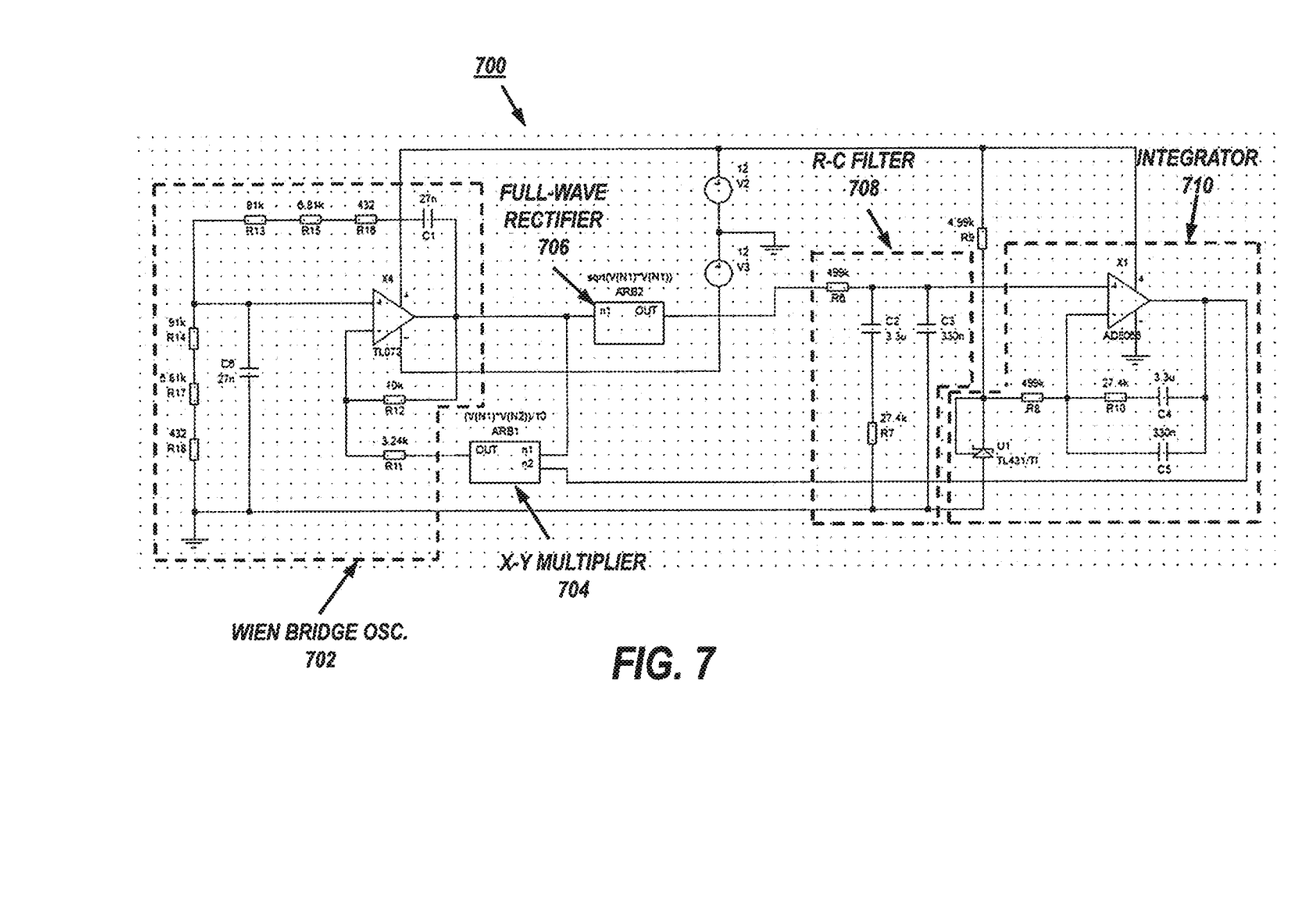
FIG. 7 shows a Wien bridge oscillator circuit under an exemplary embodiment comprising a Wien bridge oscillator, an XY multiplier circuit, a full-wave rectifier circuit, an R-C filter, and an integrator.

Turning now to FIG. 7, a Wien bridge oscillator circuit 700 is disclosed under an illustrative embodiment that may be configured to be more reliable, produces less distortion in the output, and provides greater amplitude stability than conventional Wien bridge oscillators. The circuit 700 may be comprised of a Wien bridge oscillator circuit portion 702, an XY multiplier circuit portion 704, a full-wave rectifier circuit portion 706, an R-C filter circuit portion 708 and an integrator circuit portion 710. It should be appreciated by those skilled in the art that, while the illustration provides specific components and component values (e.g., resistors, capacitors, etc.), any alternate and/or additional components and component values may be used to perform the functions disclosed herein.

Wien bridge oscillator circuit portion 702 comprises an operational amplifier X4 comprising a parallel RC network portion (e.g., R14, R17, R18, C6) coupled to the non-inverting input of amplifier X4, and to a series RC network portion (e.g., R13, R15, R16, C1), which is configured along a positive feedback path of amplifier X4 as shown in FIG. 7. Wien bridge oscillator circuit 702 also includes a first negative feedback path through resistor R12 and a second negative feedback path via XY multiplier 704.

In some illustrative embodiments, XY multiplier 704 may be configured to multiply in a plurality of quadrants (e.g., $(X_1-X_2)(Y_1-Y_2)/10V$), divide in a plurality of quadrants (e.g., with a 10V $Z/(X_1-X_2)$), perform transfer functions and square roots in one quadrant (e.g., with a transfer function ± $\sqrt{10VZ}$). In the illustrative embodiment of FIG. 7, XY multiplier 704 is configured to receive Wien bridge oscillator circuit 702 output feedback at input $n_1$ and to receive a feedback output from integrator X1 of integrator circuit portion 710 at input $n_2$. In one illustrative embodiment, multiplier 704 is configured to perform a transfer function $V_{OUT}=(V(n_1)*V(n_2))/10$ in order to change the scale of the signal and in order to provide dynamic gain control for the Wien bridge oscillator circuit 702.

Figure 8:
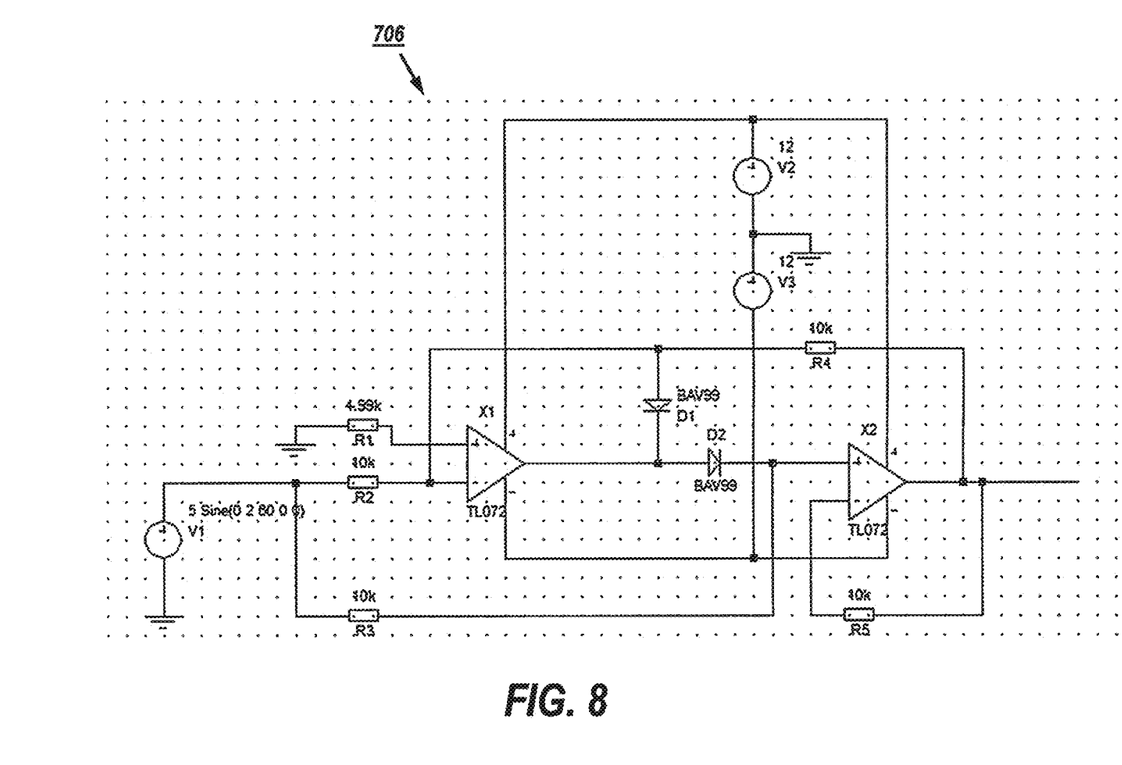
FIG. 8 shows an illustrative full-wave rectifier circuit for use in the embodiment of FIG. 7 under an embodiment.

Full wave rectifier circuit portion 706 may comprise circuitry to enable a transfer function $V_{OUT}=\text{sqrt}(V(n_1)*V(n_1))$ on the output of Wien bridge oscillator circuit 702 and provide the output to R-C filter portion 708 comprising resistors R6-R7 and capacitors C2-C3. An illustrative, non-limiting example of full wave rectifier is shown in FIG. 8, where a sine wave is provided in V1, where a negative half-cycle is received via resistor R2 in an inverting (−) input of operational amplifier X1, while the positive half-cycle is passed through resistor R3 to non-inverting input of operational amplifier X2. As the non-inverting input of amplifier X1 is coupled to ground, amplifier X1 produces a positive output that is also coupled to the non-inverting input of operational amplifier X2.

Using the illustrative, non-limiting, component values provided, it can be seen that, for the Wien Bridge oscillator circuit RC phase shift network circuitry, R1=R2=98.242 kΩ, C1=C2=27 nF, and an illustrative resonant frequency of the Wien Bridge Oscillator circuitry is $f_r$=1/R1C1=1/R2C2=60 Hz. Under the illustrative configuration, the full wave rectifier may produce substantially perfect full wave rectification of the sine wave input.

Referring back to FIG. 7, a differential integrator circuit portion 710 is coupled to the output of the full wave rectifier and the average of the full wave signal is compared to a 2.5 volt reference that may be produced by a programmable shunt regulator U1, whose reference terminal is coupled to a feedback output of integrator X1 via a series-parallel RC circuit (R8, R10, C4, C5) as shown in FIG. 7. As mentioned above, the output of the integrator X1 is fed to one input ($n_2$) of the XY multiplier 704.

The integrator circuit portion 710 may be configured to compare and integrate a difference between the average voltage reference (2.5V) and the feedback average voltage of the full wave rectifier waveform. In an illustrative, non-limiting example, the peak voltage of the Wien bridge oscillator sinusoidal waveform may be controlled at 3.9V with equation $V_{pk}=V_{avg}/0.637$ ($V_{pk}$=2.5V/0.637=3.9V).

The $n_1$ input of the XY multiplier is connected to the output of the Wien bridge oscillator circuit portion 702. In an illustrative embodiment, in the multiplier, the output of the integrator circuit portion 710 multiplies the output of the Wien bridge oscillator, (e.g., a DC voltage times a sine wave), which may produce a controlled variable amplitude sine wave. The amplitude of the output sin wave is controlled because it has to satisfy the requirements of the integrator.

Figure 9:
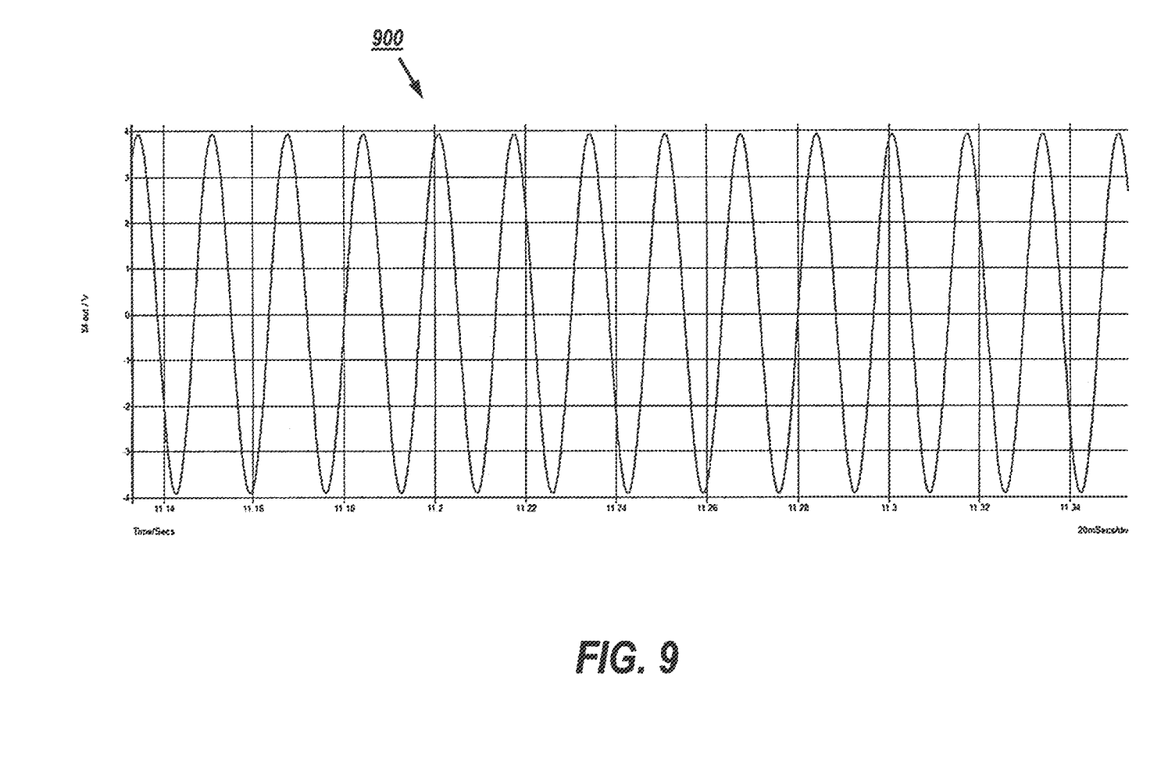
FIG. 9 shows a simulated output waveform for the Wien bridge circuit of FIG. 8, illustrating a reduction or elimination of saturation under an embodiment.
Figure 10:
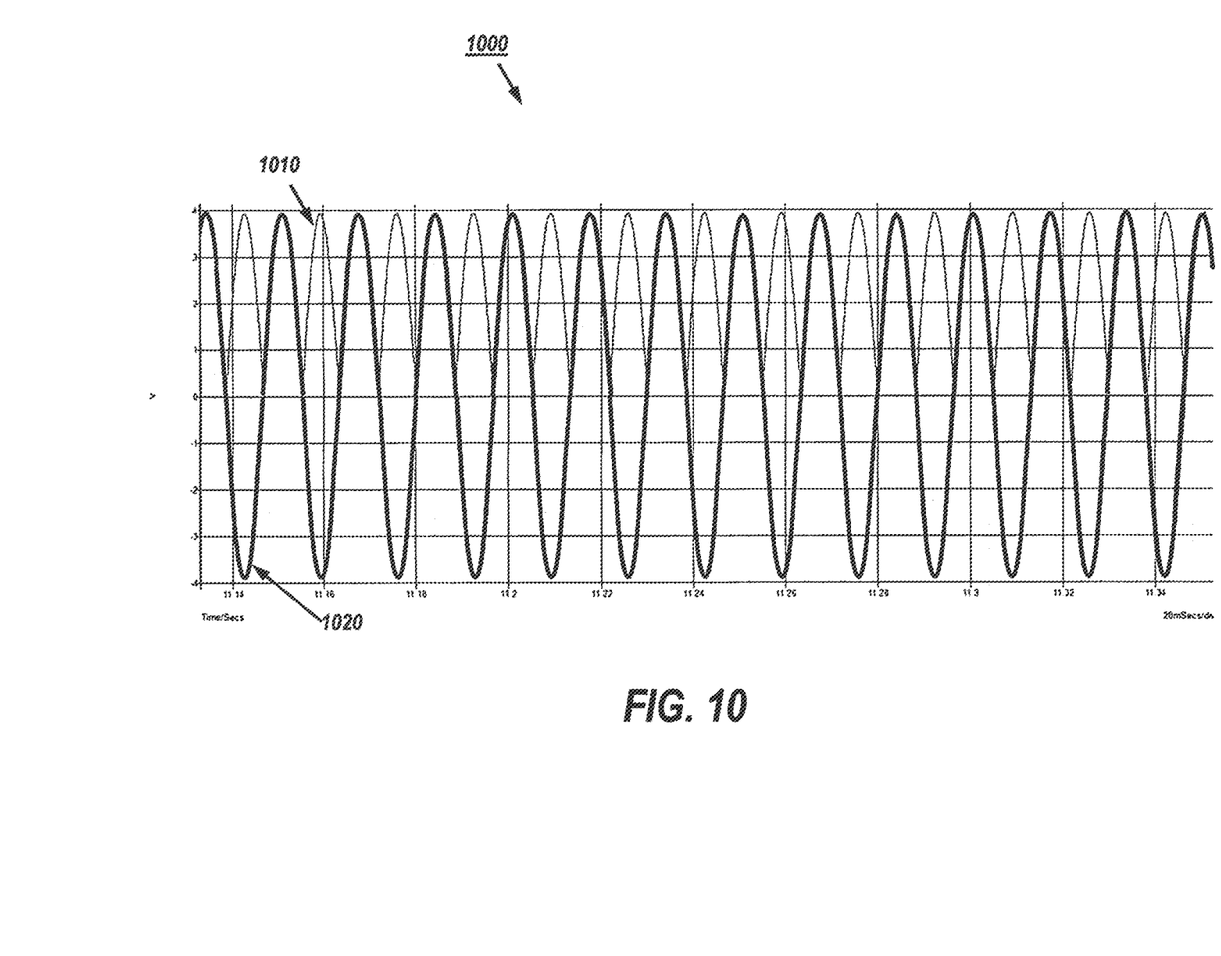
FIG. 10 shows a simulated output waveform of the Wien bridge circuit of FIG. 8, illustrating the output voltage of the full-wave rectifier together with a sinusoidal output voltage of the Wien bridge rectifier under an embodiment.
Figure 11:
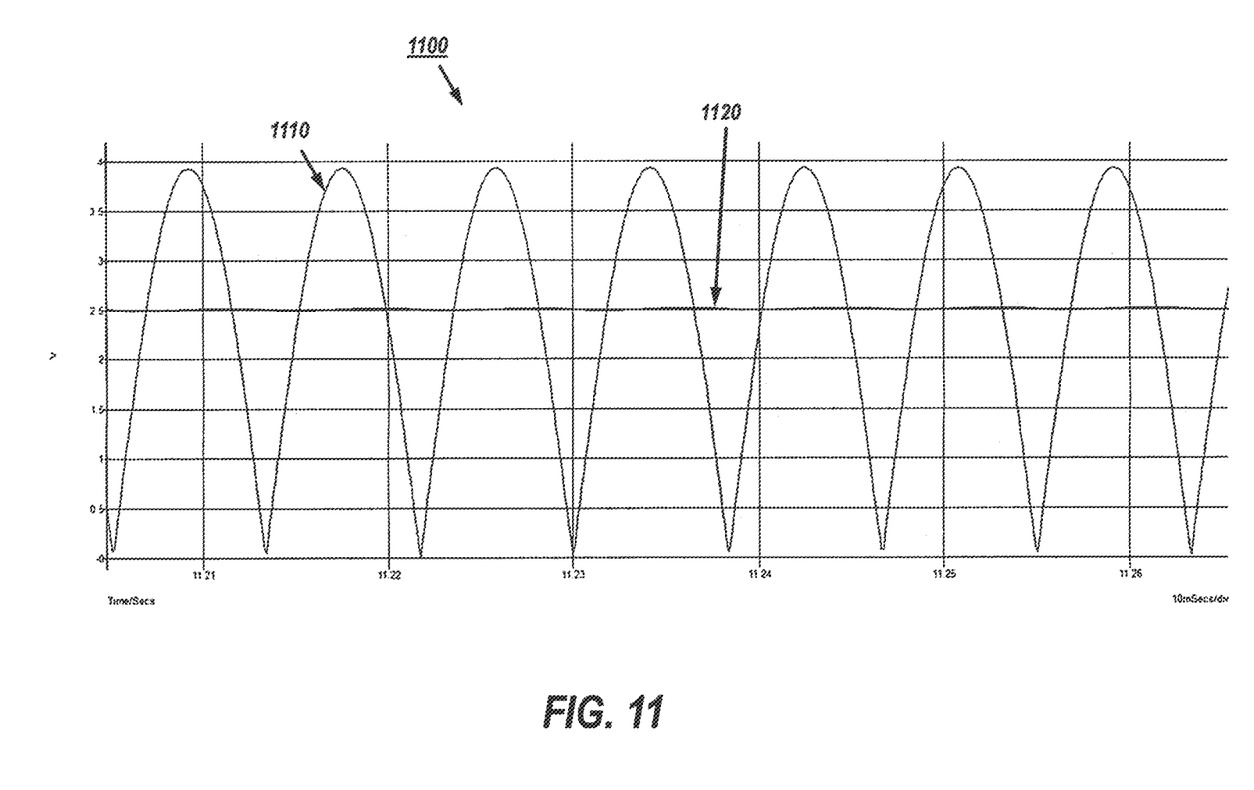
FIG. 11 shows a simulated output waveform of the Wien bridge circuit of FIG. 8, illustrating the output voltage of the full-wave rectifier together with reference voltage of an averaged full-wave rectifier and averaged value of the full-wave output voltage under an embodiment.

Turning now to FIG. 9, an illustrative, simulated output waveform for Wien bridge oscillator circuit 700 is shown. It can be seen from the non-limiting illustration that the peak voltage is controlled at 3.9V, and has no substantial distortion or saturation compared to the illustration of FIG. 6. In an illustrative, non-limiting example, FIG. 10 shows the sinusoidal voltage 1020 of the Wien bridge oscillator circuit 700 together with the voltage output 1010 of the full wave rectifier 706 which substantially produces a 3.9V peak on every positive and negative peak of the sinusoidal voltage 1020. In another illustrative, non-limiting example, FIG. 11 shows a full wave rectifier voltage output 1110 together with reference voltage of averaged full wave rectifier waveform (2.5V) and average value of the full wave output voltage (1120).

Various operational characteristics of the Wien bridge oscillator disclosed herein have many advantageous applications in electronic circuitry. Some non-limiting operational characteristics of the Wien bridge oscillator include the dynamic gain control of the oscillator and the substantially "pure" sinusoidal waveform that is produced. In some illustrative, non-limiting embodiments, the present Wien bridge oscillator may be used as an input for voltage reference in power applications, such as synchronous-buck circuits (e.g., inverters, converters, etc.).

Figure 12A:
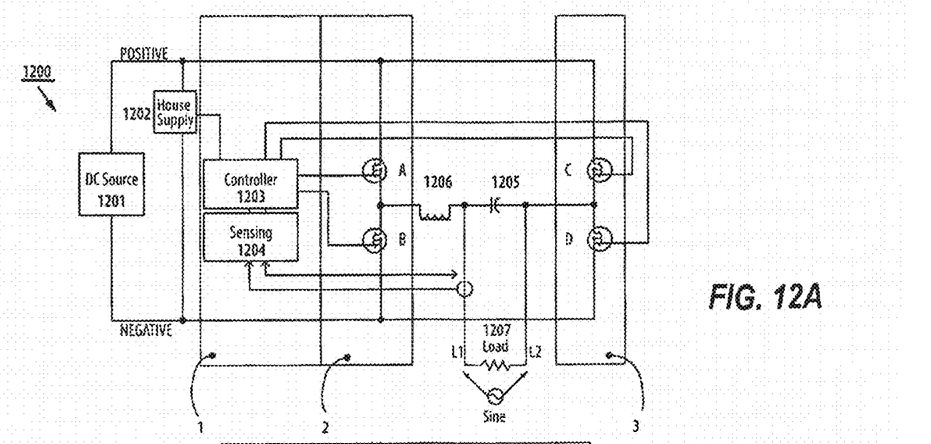
FIG. 12A illustrates an exemplary synchronous buck inverter topology under one illustrative embodiment, where the inverter comprises a high-frequency switching portion, a synchronous buck portion and a low frequency switching stage coupled to a discharge capacitor configured to be coupled to a load, where the synchronous buck inverter topology is configured to receive a voltage reference input from the Wien bridge oscillator of FIG. 7.

Turning now to FIG. 12A, synchronous buck inverter topology 1200 is disclosed in an illustrative embodiment. Inverter 1200 comprises a DC source 1201 and a house supply 1202 for providing positive and negative voltages to high frequency switches A-B and low frequency switches C-D, as shown. In an embodiment, switches A-D are comprised of high frequency switches, such as field effect transistors (FETs). It should be understood by those skilled in the art that other switches or suitable switching mechanisms may be employed, depending on the specific application of the inverter. Inverter 1200 may comprise a high frequency switching control (1) comprising controller 1203 and sensing circuit 1204.

Figure 12B:
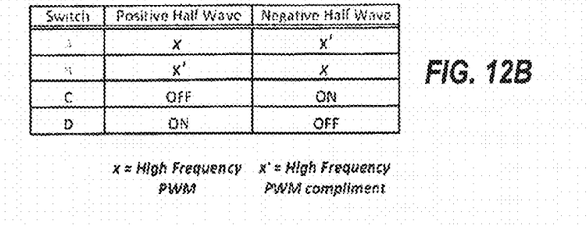
FIG. 12B illustrates a switching sequence for switches A-D of the embodiment of FIG. 12A under positive half wave and negative half wave conditions.
Figure 12C:
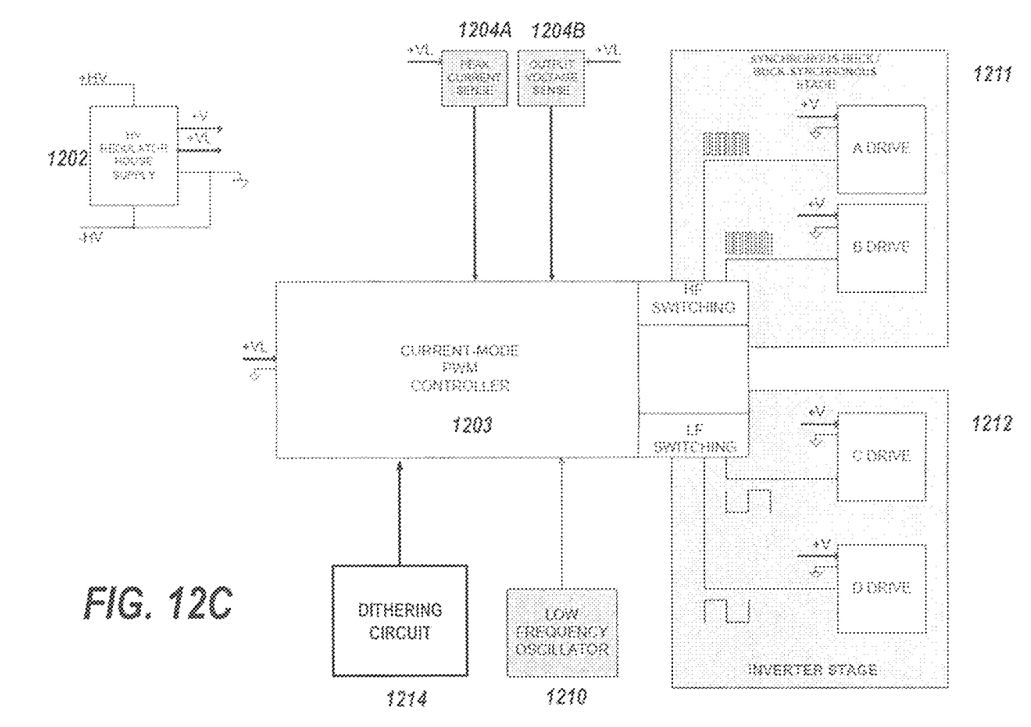
FIG. 12C provides another illustration of a synchronous buck inverter under another embodiment where the synchronous buck inverter is configured to receive a voltage reference input from the Wien bridge oscillator of FIG. 7.

In an embodiment, controller may comprise a current-mode PWM controller (see FIG. 12C) and sensing circuit 1204 comprises a peak current sense and an output voltage sense (see refs. 1204A-B of FIG. 12C). Controller 1203 may be operatively coupled to a gate of each of switches A-D, while sensing circuit 1204 may be coupled to a load line as is shown illustratively in FIG. 12A. Alternatively, controller may be a microprocessor running firmware to control switches A-D.

Controller 1203 may be configured to provide a low frequency sine wave (or other suitable signal) to effect switching control on the synchronous-buck portion of inverter 1200. In some illustrative embodiments, controller 1203 may utilize the Wien bridge oscillator 700 disclosed above. Main switching may be realized using synchronous-buck switching portion (2), comprising switches A and B, to invert every half cycle of the frequency of the signal provided by controller 1203. The inverting process thus creates a positive and negative transition of the sine wave signal. Low frequency switching stage (3) comprises switches C and D and may be configured to operate as zero voltage switching (ZVS) and zero current switching (ZCS) drives Notably, using the configuration of FIG. 12A, the charge on output capacitor 1205 is discharged to zero on every zero crossing of low frequency switching stage (3). Compared to a conventional synchronous buck, the configuration of FIG. 12A advantageously discharges energy every half cycle. During this discharge of energy, the zero crossing distortion in the low frequency sine wave is greatly reduced.

In an embodiment, the fabricated switch material for synchronous-buck switching portion (2) (e.g., switches A-B) may be different from the fabricated switch material for low frequency switching stage (3) (e.g., switches C-D). In an advantageous embodiment, switches A-B may be fabricated on a Silicon Carbide (SiC) platform, which allows the switches to operate at higher frequencies and deliver higher circuit efficiencies. As SiC switches have a reduced on state drain to source resistance ($R_{ds(on)}$), this improves on-state voltages and allows for higher power applications Since a SiC switch is a majority carrier device, there is no associated storage time to cause current tail issues within the switch.

Consequently, the SiC switch enables high voltage switching at higher frequencies (e.g., greater than 50 kHz). Additionally, the total gate charge on a SiC switch is a multitude (e.g., 3 times) less than for a comparable silicon switch, resulting in yet further gains in the upper frequency limit and/or reduction of switching loss. By utilizing SiC switches (A-B) in the synchronous-buck switching portion (2), numerous advantages may be achieved, including, but not limited to, improved switching, reduced harmonic distortion, reducing the need for large filters (e.g., inductors) at the output, and improved load step response. Similar advantages may be realized by using other high-frequency majority-carrier switches, such as Gallium Nitride (GaN), which also has a total gate charge that is a multitude (e.g., one-fifth) less than comparable silicon switches and reduced $R_{ds(on)}$, allowing switching applications to exceed 2 MHz in frequency and facilitating large step down ratios in the synchronous-buck switching portion (2).

Turning now to FIG. 12B, an exemplary switching sequence is illustrated wherein switches A and B of the synchronous-buck switching portion (2) simultaneously and alternately provide high frequency PWM (x) and high frequency PWM complement (x') for each positive half wave and negative half wave. Switches C and D for the low frequency switching stage (3) are configured such that switch C is OFF for each positive half wave and ON for each negative half wave, while switch D is ON for each positive half wave and OFF for each negative half wave.

FIG. 12C is another exemplary embodiment of a synchronous buck inverter, similar to inverter 1200, wherein high voltage regulator house supply 1202 receives input power (+HV, −HV) from a source (e.g., 1201) and produces output voltage +V for each of the switch drives (A-D Drive) and voltage +VL for current-mode PWM controller 1203, peak current sense 1204A and output voltage sense 1204B. Controller 1203 may provide low frequency signals (e.g., sine wave) via low frequency oscillator 1210, which may utilize the Wien bridge oscillator 700 disclosed above. Controller 1203 as illustrated in the embodiment of FIG. 12C may comprise a high frequency (HF) switching portion and low frequency (LF) switching portion, wherein HF switching portion activates/deactivates switches associated with A DRIVE and B DRIVE of synchronous-buck/buck-synchronous stage 1211. LF switching portion may activate/deactivate switches associated with C DRIVE and D DRIVE of inverter stage 1212.

In an illustrative embodiment, the PWM controller 1203 may be coupled to a dithering circuit 1214 which may be configured to apply a waveform to a timing circuit of controller 1203 to dither the switching frequency. For example, a triangular waveform may be applied to a timing circuit of controller 1203 to cause the frequency to change a certain amount (e.g., ±10 kHz) for a given switching frequency (e.g., 100 kHz). By reducing switching frequencies at zero-crossings, the inverter performance may be improved by increasing resolution and decreasing harmonic distortion.

For example, a triangular waveform (e.g., 2-3V peak) may be applied for ±8 kHz dithering to a timing circuit to cause the frequency to change a certain amount for a given switching frequency. Accordingly, under the non-limiting example, the switching frequency dither increases to 108 kHz at a peak, and decreases to 92 kHz at a zero crossing. By reducing switching frequencies at zero-crossings, an inverter performance may be improved by increasing resolution and decreasing harmonic distortion. Of course, it should be appreciated by those skilled in the art that other suitable dithering frequency ranges may be used, and are not limited to the specific example.

As mentioned above in connection with FIG. 12A, conventional synchronous buck converters typically rely on an H-Bridge topology and a single-polar or double-polar switching scheme to produce a steady DC output voltage. However, such configurations are subject to high power losses. Additionally, since conventional configurations rely on the load to pull the voltage down to zero, this may further introduce significant harmonic distortions, particularly with small loads.

Under some illustrative embodiments, the technologies and techniques described herein may be used for a synchronous buck converter to produce a steady DC output voltage. Under an illustrative embodiment shown in FIG. 13A, the synchronous switches S1 and S2 of the simplified figure may be configured as high frequency switches to have on/off states (an "on" state illustrated as dotted line in the figure) to cause current to flow through inductor L1 (illustrated as dotted line arrows in the figure) to produce a varying rectified sinusoid shown in FIG. 13B.

Figure 13A:
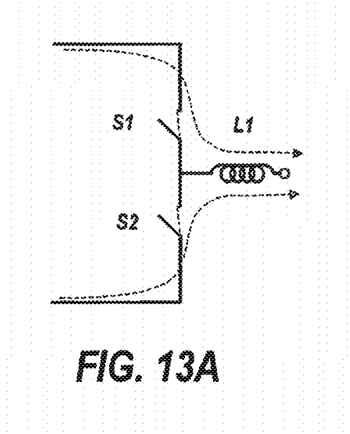
FIG. 13A shows a simplified circuit for operating synchronous high frequency switches to cause current to flow across an inductor under an illustrative embodiment.
Figure 13B:
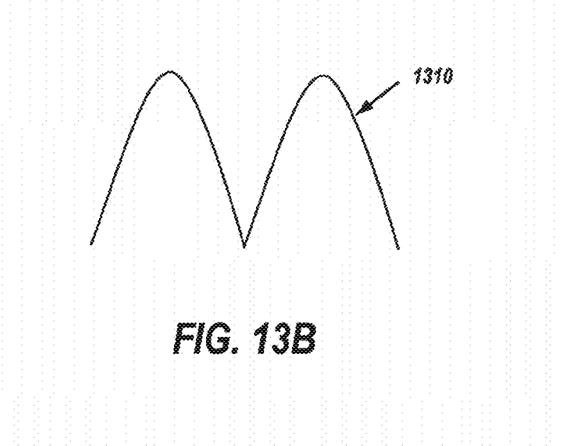
FIG. 13B illustrates a simulated waveform of a rectified sinusoid produced by the simplified circuit of FIG. 13A under an embodiment.
Figure 14A:
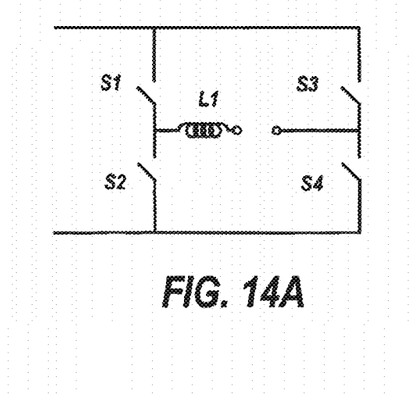
FIG. 14A shows a simplified circuit comprising low frequency switches added to the circuit of FIG. 13A.
Figure 14B:
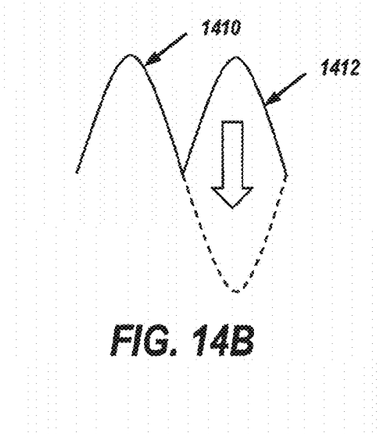
FIG. 14B illustrates a simulated waveform of a rectified sinusoid in which a portion of the rectified sinusoid is to be inverted using the simplified circuit of FIG. 14A.
Figure 14C:
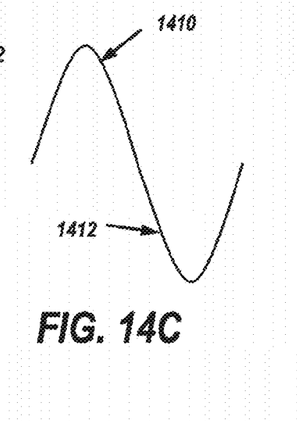
FIG. 14C illustrates a simulated waveform of a rectified sinusoid in which a portion of the rectified sinusoid is inverted using the simplified circuit of FIG. 14A.

In some illustrative embodiments, low frequency switches may be added to the circuit of FIG. 13A. Turning to FIG. 14A, low-frequency switches S3 and S4 are added as shown in the simplified embodiment, and are configured to synchronously switch with switches S1 and S2 to actively pull down voltage to produce waveforms illustrated in FIG. 14B and FIG. 14C. In the simplified waveform illustrated in FIG. 14B, the switching of S3 and S4 is configured to "un-fold" or invert a portion 1410 of the rectified signal 1412 (in the direction of the arrow as shown) to produce a sine wave illustrated in FIG. 14C comprising signal 1410 and inverted portion 1412. In some illustrative embodiments, switches S1 and S2 may be fabricated from SiC or GaN (discussed above in connection with FIG. 12A) to provide further advantageous switching and circuit response properties. Using techniques described herein, reduced harmonic distortion may be advantageously achieved. With better control over harmonic distortion, bulky, low-frequency output inductors may be significantly reduced. Moreover, the disclosed configurations are much more responsive to load changes.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those of ordinary in the pertinent art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein. That is, the claims which follow are to be accorded their respective broadest scope in light of the exemplary disclosure made herein.

What is claimed is:

1. An oscillator circuit, comprising:
   a Wien bridge oscillator circuit;
   a full-wave rectifier circuit, coupled to an output of the Wien bridge oscillator circuit;
   an integrator circuit, electrically connected to an output of the full-wave rectifier circuit; and
   a multiplier circuit, comprising a first input coupled to the output of the Wien bridge oscillator circuit, and a second input, coupled to an output of the integrator, the multiplier circuit being configured to provide a signal to an input of the Wien bridge oscillator circuit, wherein the multiplier circuit comprises an XY multiplier, and wherein the multiplier circuit is configured to execute the transfer function ($V_{OUT}$) in accordance with $$V_{OUT}=(V(n_1)*V(n_2))/10V,$$

where $V(n_1)$ is the voltage at the first input and $V(n_2)$ is the voltage at the second input.

2. An oscillator circuit, comprising:
   a Wien bridge oscillator circuit;
   a full-wave rectifier circuit, coupled to an output of the Wien bridge oscillator circuit and configured to execute a transfer function on voltage received at an input;
   an integrator circuit, electrically connected to an output of the full-wave rectifier circuit; and
   a multiplier circuit, comprising a first input coupled to the output of the Wien bridge oscillator circuit, and a second input, coupled to an output of the integrator, the multiplier circuit being configured to provide a signal to an input of the Wien bridge oscillator circuit;
   wherein the full wave rectifier is configured to execute the transfer function ($V_{OUT}$) in accordance with $$V_{OUT}=\mathrm{sqrt}(V(n_1)*V(n_1)),$$

where $V(n_1)$ is a voltage output of the Wien bridge oscillator received at an input of the full wave rectifier.

3. A method for operating an oscillator circuit, comprising:
   generating a signal from a Wien bridge oscillator circuit;
   rectifying the signal via a full-wave rectifier circuit, coupled to an output of the Wien bridge oscillator circuit;
   providing the rectified signal to an integrator circuit, electrically connected to an output of the full-wave rectifier circuit, to provide an integrated output signal;
   receiving the signal from the Wien bridge oscillator circuit at a first input of a multiplier circuit, wherein the multiplier circuit comprises an XY multiplier;
   receiving the integrated output signal at a second input of the multiplier circuit; and
   dynamically controlling gain in the Wien bridge oscillator circuit via the multiplier using the generated signal from the Wien bridge oscillator circuit and the integrated output signal, wherein dynamically controlling the gain comprises executing a transfer function in the multiplier circuit using the generated signal from the Wien bridge oscillator circuit and the integrated output signal; and wherein the transfer function ($V_{OUT}$) is executed in accordance with $$V_{OUT} = (V(n_1) * V(n_2))/10V,$$

where $V(n_1)$ is the voltage at the first input and $V(n_2)$ is the voltage at the second input.

4. An oscillator circuit, comprising:

a Wien bridge oscillator circuit to generate a signal;

a full-wave rectifier circuit, coupled to an output of the Wien bridge oscillator circuit to rectify the generated signal;

an integrator circuit, electrically connected to an output of the full-wave rectifier circuit to integrate the rectified generated signal; and a multiplier circuit, comprising a first input coupled to the output of the Wien bridge oscillator circuit, and a second input, coupled to an output of the integrator, the multiplier circuit being configured to provide a signal to an input of the Wien bridge oscillator circuit to dynamically control the gain, wherein the multiplier circuit is configured to execute a transfer function on voltage received at the first input and the second input, and wherein the multiplier circuit is configured to execute the transfer function ($V_{OUT}$) in accordance with $$V_{OUT} = (V(n_1) * V(n_2))/10V,$$

where $V(n_1)$ is the voltage at the first input and $V(n_2)$ is the voltage at the second input.

* * * * *